(12) United States Patent
Gaebler et al.

(10) Patent No.: US 9,153,716 B2
(45) Date of Patent: Oct. 6, 2015

(54) SEMICONDUCTOR COMPONENT WITH A WINDOW OPENING AS AN INTERFACE FOR AMBIENT COUPLING

(71) Applicant: X-FAB SEMICONDUCTOR FOUNDRIES AG, Erfurt (DE)

(72) Inventors: Daniel Gaebler, Apolda OT Sulzbach (DE); Wolfgang Einbrodt, Erfurt (DE)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 14/518,330

(22) Filed: Oct. 20, 2014

(65) Prior Publication Data

US 2015/0035027 A1 Feb. 5, 2015

Related U.S. Application Data

(63) Continuation of application No. 13/499,446, filed as application No. PCT/IB2009/054280 on Sep. 30, 2009, now Pat. No. 8,865,553.

(51) Int. Cl.
| | | |
|---|---|---|
| *H01L 31/0224* | (2006.01) | |
| *H01L 31/0232* | (2014.01) | |
| *H01L 27/146* | (2006.01) | |
| *H01L 31/02* | (2006.01) | |
| *H01L 31/028* | (2006.01) | |
| *H01L 31/113* | (2006.01) | |
| *H01L 21/8234* | (2006.01) | |

(52) U.S. Cl.
CPC .... *H01L 31/02327* (2013.01); *H01L 27/14618* (2013.01); *H01L 31/02005* (2013.01); *H01L 31/028* (2013.01); *H01L 31/022408* (2013.01); *H01L 31/1136* (2013.01); *H01L 21/823475* (2013.01); *H01L 2924/0002* (2013.01)

(58) Field of Classification Search
CPC ............... H01L 31/0224; H01L 31/02327; H01L 27/14603; H01L 27/1462; H01L 29/4238
USPC .................................................. 257/431, 432
See application file for complete search history.

(56) References Cited

U.S. PATENT DOCUMENTS

| | | | | |
|---|---|---|---|---|
| 4,821,093 | A * | 4/1989 | Iafrate et al. ................ | 257/194 |
| 5,345,095 | A * | 9/1994 | Niwayama .................... | 257/138 |
| 6,197,639 | B1* | 3/2001 | Lee et al. ...................... | 438/258 |
| 6,372,560 | B1* | 4/2002 | Jen et al. ....................... | 438/160 |
| 7,851,370 | B2* | 12/2010 | Kuo et al. ..................... | 438/734 |
| 8,053,298 | B2* | 11/2011 | Bhalla et al. ................. | 438/186 |
| 2005/0067640 | A1* | 3/2005 | Ohkawa ........................ | 257/291 |
| 2010/0230744 | A1* | 9/2010 | Phua et al. .................... | 257/325 |
| 2010/0283101 | A1* | 11/2010 | Chen et al. ................... | 257/325 |
| 2011/0241644 | A1* | 10/2011 | Hashimoto et al. .......... | 323/299 |
| 2012/0135596 | A1* | 5/2012 | Kang et al. ................... | 438/594 |
| 2012/0306010 | A1* | 12/2012 | Lerner et al. ................. | 257/335 |

* cited by examiner

*Primary Examiner* — George Fourson, III
(74) *Attorney, Agent, or Firm* — Hunton & Williams LLP

(57) ABSTRACT

A window opening in a semiconductor component is produced on the basis of a gate structure which serves as an efficient etch resist layer in order to reliably etch an insulation layer stack without exposing the photosensitive semiconductor area. The polysilicon in the gate structure is then removed on the basis of an established gate etching process, with the gate insulation layer preserving the integrity of the photosensitive semiconductor material.

17 Claims, 7 Drawing Sheets

Figure 1:
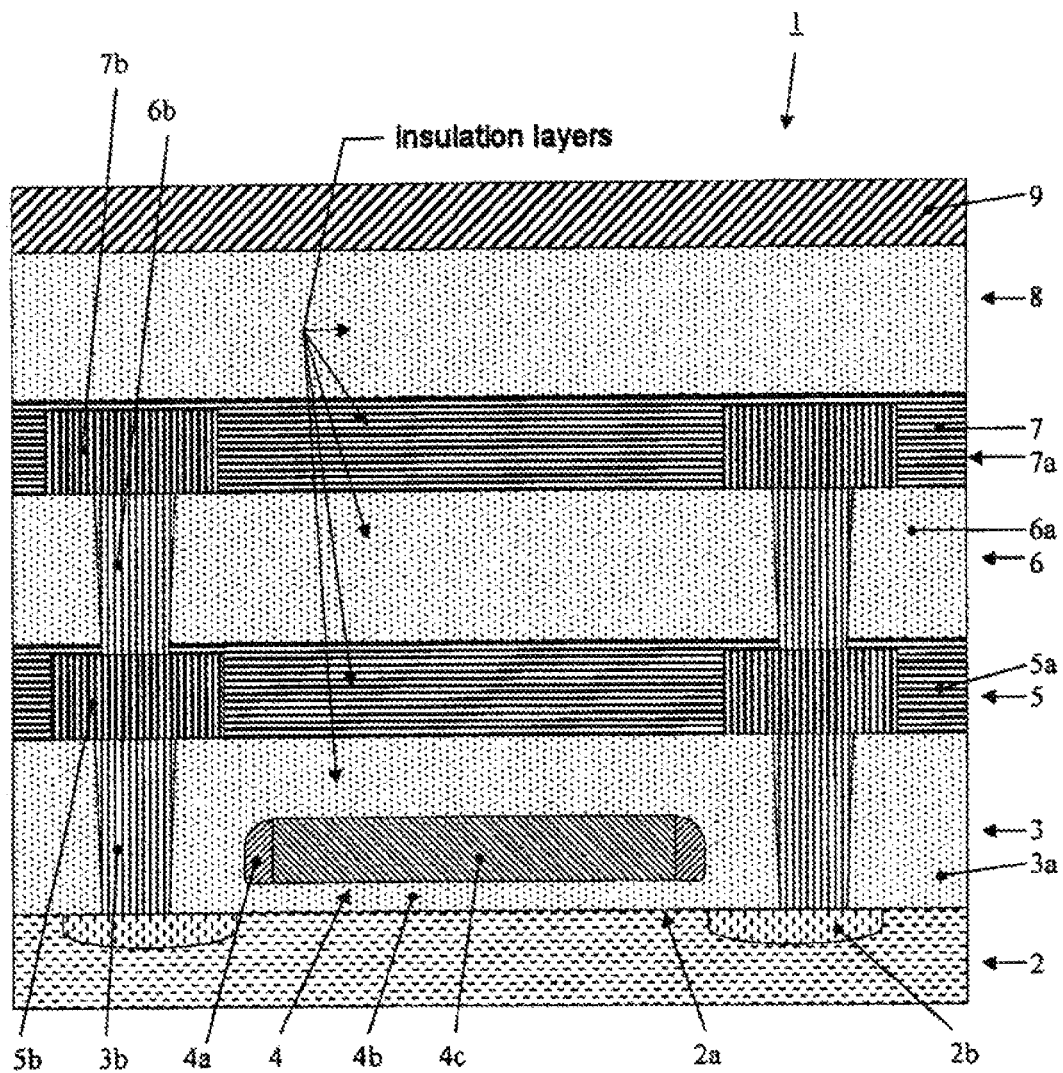

SEMICONDUCTOR COMPONENT WITH A WINDOW OPENING AS AN INTERFACE FOR AMBIENT COUPLING

RELATED APPLICATIONS

This application is a continuation of U.S. patent application Ser. No. 13/499,446, filed Mar. 30, 2012, now U.S. Pat. No. 8,865,553, the disclosure of which is hereby incorporated by reference in its entirety.

The invention relates to semiconductor components, in particular CMOS components, and their production, wherein one or more dielectric layers are to be structured over a semiconductor area so that an interaction of the semiconductor area with external influencing variables, in particular as optical interaction by means of radiation, is possible

PRIOR ART

Semiconductor components are produced for many application purposes, and many different processing techniques are used. Because of the increasing progress of the participating production techniques involved, the structure sizes of the individual circuit elements have been made ever smaller, so that a large number of circuit elements can be combined into a complex circuit on a single chip surface. For more complex circuits, the CMOS (complementary metal oxide semiconductor) technique has been shown to be very efficient with regard to the performance and cost efficiency of the production process, In CMOS technology, mainly complementary field effect transistors, that is p-channel transistors and n-channel transistors, with other circuit elements such as resistors, capacitors, and the like, are produced in and on a semiconductor layer, usually a silicon layer, using multiple process steps. To produce the field effect transistors (or transistors for short) in CMOS technology, a gate structure which controls the conductivity of a semiconductor area, also called a channel area, must be produced. The channel area in turn connects a drain area to a source area, so that a controllable current flow can occur in the transistor. The drain and source areas are relatively strongly doped regions in the semiconductor layer, and are usually produced by ion implantation, the gate structure acting as required, together with spacers on the side walls of the gate structure, as an implantation mask, so that "self-adjusting" positioning of the drain and source areas is achieved in relation to the channel area, which is under the gate structure.

The gate structure includes a "thin" gate insulation layer, which is usually made of silicon dioxide, and on which a polysilicon layer, which acts as an electrode for applying a control voltage to control the current flow in the channel area, is formed. To produce the gate structure, well established methods are used, in which after production of insulation structures in the silicon layer and after generation of the appropriate trough dopings for the complementary transistors the gate insulation layer is generated first, for example by oxidation of the silicon material of the semiconductor layer. The thickness of the gate insulation layer is determined by the transistor properties, and is about several tens of nanometres (nm) down to two nm if the most modern MOS transistors and complex CPUs are considered. The silicon material, which acts as the electrode material, is then deposited, and the resulting layer stack is then structured, further material layers in the form of ARC (anti-reflective coating) and the like being provided if required. The structuring is done by producing a lacquer mask, on the basis of which an etching process is carried out in the form of a plasma-supported process, in which the silicon electrode material is removed selectively to the mask material, and the etching chemistry in particular is very selective in relation to the gate insulation layer, so that the plasma etching process stops reliably in the gate insulation layer, even for very thin gate insulation layers. For this purpose, well known etching recipes using chromium, fluorine or the like reactive materials with suitable plasma parameters are used. The gate insulation layer outside the gate structure, which previously acted as a material to stop the etching. is then removed, for example by gentle wet chemical etching agents, for example hydrofluoric acid, without the silicon layer below it being significantly damaged.

Subsequently, the drain and source areas are produced, for example by ion implantation, in which case a spacer structure can also be provided on the side walls of the gate structure, to set the lateral distance of the implantation areas from the actual electrode material and thus from the channel area. After the component is baked, a metallic silicide is usually produced at least in the drain and source areas, to reduce the contact resistance, in which case an upper region of the polysilicon of the gate structure can also be siliconised.

To connect the individual circuit elements, typically one or more metallisation levels, in which dielectric materials or insulation layers enclose corresponding metal lines and contact lead-throughs, are provided, contact openings then being produced in a final insulation layer or passivation layer, to contact the metallisation system, for example with bonding wires.

Thus complex CMOS semiconductor components can be produced with a tested process technology and yet with a complex circuit structure, and even cost-efficiently.

However, because of the integration of many kinds of circuits into a single chip, the result is also increasingly the requirement for applications in which the circuits not only communicate electrically with the environment via the metallisation system and contacts, but also interaction via other mechanisms should be possible. In particular, optical components are increasingly integrated into CMOS/BiCMOS components, for which purpose an optical interface, for example for receiving incident light, is necessary. For this purpose, a window is provided in the insulation stack of the metallisation system over a silicon layer region, which is used for the interaction with the incident light and thus acts as a photosensitive surface.

The simplest variant for removing the insulation stack over the photosensitive silicon surface consists of masking with lacquer those areas of the insulation stack which are not to be removed, and a subsequent etching process which stops in the silicon, as described for example in DE 102 39 643 A. For CMOS integration, only dry etching can be used for the etching process, since the side walls of the window opening should be as steep as possible, and the danger of etching metallisation levels, with consequent loss of function of the whole chip, is too great. Current dry etching processes are usually incapable of ensuring high selectivity between silicon and the common insulators, for example silicon dioxide ($SiO_2$), silicon nitride ($Si_3N_4$), with a simultaneously high etch rate of the insulator layers. Another difficulty is that the layer thicknesses of the insulator layers are subject to large variations of thickness of up to about 10%, caused by the process, and therefore significant over-etching is required if it is to be ensured that all insulator layers are removed from the silicon surface with no residue. The over-etching generates defects in the sensitive silicon surface, and these have a disadvantageous effect on the optical performance. The silicon removal also ensures that the doping profiles, and consequently the properties of the integrated semiconductor components, are changed.

More advanced methods attempt as far as possible not to bring the silicon surface directly into contact with a dry etching step. There are two ways of doing this.

On the one hand, the silicon surface is first exposed by a short wet etching step, which damages it less, to achieve better optical performance. However, such a short wet etching process cannot be well controlled, and risks etching the side walls if they are not elaborately protected.

On the other hand, an etch stopping layer, on which the dry etching process stops without touching the silicon surface, is included in addition to the standard CMOS process. An example of this is given in patent specification US 2007 0072326 B2. The remaining etch stopping layer has a disadvantageous effect, since it must remain on the silicon surface if the latter is to remain free of defects. In the above-mentioned patent specification, therefore, depositing one or more reflection-reducing layers (anti-reflective coating, ARC for short) under the etch stopping layer is attempted. The actual etch stopping layer is then removed, and the ARC layer in turn acts as the etch stopping layer. This method is very laborious, since multiple layers must be integrated into the CMOS process, and must not cause disadvantageous changes there. Laborious etching in several stages is also necessary, to leave finally only the ARC layer. The low etch rate selectivity of the proposed etch stopping layers with respect to the medium to be etched is also problematic.

Another method according to DE 10 2006 027 969 describes the use of layers which are inherent to the CMOS process as etch stopping layers. However, in this method, because of the low etch rate selectivity between $SiO_2$ and $Si_3N_4$, wet etching is necessary, and is therefore both laborious and hazardous.

Overview of the Invention

It is therefore an object of the invention to create a window opening in an insulation material of a semiconductor component, said opening making interaction, in particular optical interaction, of a semiconductor area with the environment possible, and as far as possible avoiding damage to the interacting semiconductor area. A high degree of compatibility with existing CMOS/BiCMOS processes is to be achieved.

In one aspect, the object is achieved by a method for structuring a dielectric material in a semiconductor component. The method comprises; producing a gate structure on a semiconductor area, the gate structure having a gate insulation layer, which is formed on the semiconductor area, and an electrode layer, which is formed on the gate insulation layer. One or more dielectric layers are produced over the gate structure and an etching mask is formed on the one or more dielectric layers, the etching mask determining the lateral position and lateral size of a window opening to be formed over the gate structure in the one or more dielectric layers. The one or more dielectric layers are etched by means of the etching mask, using the electrode layer as a first etch stopping material, and the electrode layer is then etched, using the gate insulation layer as a second etch stopping material.

Thus in the method according to the invention, the insulation layer(s) is/are structured using existing material systems, so that to produce the window no further etch stopping materials are required. The window can thus define a region of the semiconductor area which can be used as an interface for interaction with the environment, for example to receive/emit radiation in the form of optical radiation, as a sensor surface, and the like, the region which is used for interaction being protected by the gate insulation layer at least during the etching process. Since typically the gate insulation layer has a well defined layer thickness and well defined material properties, this layer can remain on the semiconductor area.

The etching through the insulation layer(s) can be carried out on the basis of well known plasma etching methods, since these have high selectivity for electrode materials such as polysilicon. For example, the gate structure in CMOS processes includes a polysilicon layer, a few 100 nm thick, which is often also siliconised. Dry etching processes with a high etch rate for insulator layers of $Si_3N_4$, $SiO_2$ and other materials in common use have high selectivity to the polysilicon layer. It is thus possible to absorb the existing layer thickness variations of the insulator layers by high over-etching, in a stable process. The etching of the gate structure has the advantageous effect that if siliconised regions exist, these regions are removed. Subsequent gate etching according to well known plasma etching methods removes the remaining polysilicon reliably, and has such high selectivity to gate oxide that the latter is removed by only a few or only less than one rim. This makes very high process stability possible, even in the case of highly variable degrees of coverage and very thin gate insulation structures.

The remaining gate insulation layer achieves high freedom from defects of the semiconductor layer which acts as the active interaction layer, so that, for example in the case of optical applications, the result is high optical performance. This is particularly noticeable in the blue sensitivity of photocells.

Advantageously, the electrode layer is etched using the etching mask. For this purpose, the etching mask, for example in the form of a lacquer material, is produced so that in both etching steps it protects the regions of the dielectric layers outside the window opening which are not involved, so that a single lithography step is enough to produce the window opening.

In a further embodiment, a contact opening is formed in one or more dielectric layers, to expose a connection surface for contact with a housing of the semiconductor component. The window is thus produced in a metallisation system in which contact openings are produced, for example to receive a bonding wire. Thus the method according to the invention can be integrated efficiently into standard method sequences for producing CMOS components.

In one embodiment, the contact opening is formed after the electrode layer is etched, so that an effect on the connection surfaces by the etching processes for forming windows is avoided.

In a further embodiment, a reflection-reducing layer is deposited on the exposed gate insulation layer. Thus the optical behaviour of the window can be set by the additional layer.

In a further embodiment, a metal silicide is formed in at least one portion in the electrode layer of the gate structure, the metal silicide being formed in a region of the electrode layer which corresponds at least to the lateral position and size of the window opening. The metal suicide can thus be removed effectively by the first etching process, without the necessity of masking this region in a process for producing the metal silicide.

In other embodiments, the metal silicide is formed outside the region which corresponds to the lateral position and size of the window opening, This can result in improving the evenness of the etching process, in particular if very complex metallisation systems with many dielectric layers are to be etched.

In a further advantageous embodiment, a cleaning process is carried out after the electrode layer is etched. In this way etching byproducts such as polymer residues and is the like can be removed efficiently, which has an advantageous effect on the properties of the window opening as an interface for interaction with the environment. For example, the optical properties of the surface of the gate insulation layer are improved, In other cases, the window can be used for adhesion of fluids in sensors, so that improved chemical purity contributes to higher sensitivity.

In a further advantageous embodiment, material of the gate insulation layer is removed to set a residual thickness of the gate insulation layer, In this way, the influence of the gate insulation layer on the coupling or interaction of the semiconductor area under it with the environment, for example in the form of an optical coupling, can be controlled.

In one embodiment, the removal to set the residual thickness takes place when the cleaning process is carried out Many efficient cleaning recipes which also result in a certain material erosion of the gate insulation layer are available, and this is advantageously used to set the desired residual thickness.

In a further embodiment, the method includes the generation of a dopant distribution in the semiconductor area, at least in a region which corresponds to the lateral position and size of the window opening, to set an optical behaviour in cooperation with the window opening of the semiconductor component. For example, the dopant concentration can be adapted locally to the desired type of interaction, and this can take place within the trough implantations or by particular doping processes. A pn junction can be provided.

The existing properties of the optical behaviour are retained, since no influence by the structuring process takes place. For example, no higher leakage currents are caused by damaged semiconductor surfaces and the like. Thus very sensitive regions can be produced, for example pixels of optical sensors. Because of the improved structuring properties in association with the better electronic behaviour of the interaction region of the semiconductor area, very small components, which thus make it possible to build finely resolving optical components, can be generated.

According to a further aspect of the claimed invention, the above-mentioned object is achieved by a gate structure which is formed on a semiconductor area, and which has a gate insulation layer formed on the semiconductor area and an electrode layer formed on the gate insulation layer. A metallisation system with at least one insulation layer is also provided. A window opening is also formed in the at least one insulation layer and in the electrode layer, the window opening acting as an interface for coupling between, a part of the semiconductor area and the environment.

In particular in production of the component according to the invention, the above. mentioned advantages occur, the arrangement of the window opening over a gate structure giving the possibility of generating openings with desired lateral dimensions, thus also very small openings, without the particular structure of the metallisation system having a significant influence.

Advantageously, the window opening extends as far as the gate insulation layer, so that the semiconductor region below it is effectively protected.

In a further embodiment, the window opening has one or more optical adjustment layers, which are formed at least on the gate insulation layer. The optical properties of the window can be effectively set on these.

In illustrative embodiments, the electrode layer comprises of polysilicon, so that a high degree of compatibility with conventional CMOS components is achieved.

In one embodiment the electrode layer has, laterally adjacent to the window opening, a metal silicide, whereas in other embodiments an electrode layer region which is laterally adjacent to the window opening is made of polysilicon.

In an advantageous embodiment, the window opening is the optical interface of a photodiode. Retaining high quality of the semiconductor surface under the window also results in very good properties of the photodiode, for example high sensitivity in the blue region of the optical spectrum, greater than 0.28 A/W for 405 nm wavelength, or a low dark current, less than 0.2 pA/$\mu m^2$.

In an advantageous embodiment, the window opening is the optical interface of a pixel of an opto-electronic region of the semiconductor component. As shown above, the result of the structure of the window is good structurability, in which very small lateral dimensions in the range of up to a few hundred nm are achieved, so that in association with the good electronic properties a desired number of pixels can be provided.

In an advantageous embodiment, the window opening is the optical interface of a phototransistor, the improved properties here too being achieved for overall better behaviour with lower processing costs.

In further embodiments, two or more window openings, which act as optical interfaces. are provided, as was also shown above.

In other embodiments, a high degree of compatibility with advanced CMOS components is achieved by, for example, the electrode layer having a thickness of 100 nm (nanometres) to 500 nm, and/or a thickness of the gate insulation layer under the window opening being between 3 Nm and 20 nm.

Figure 2:
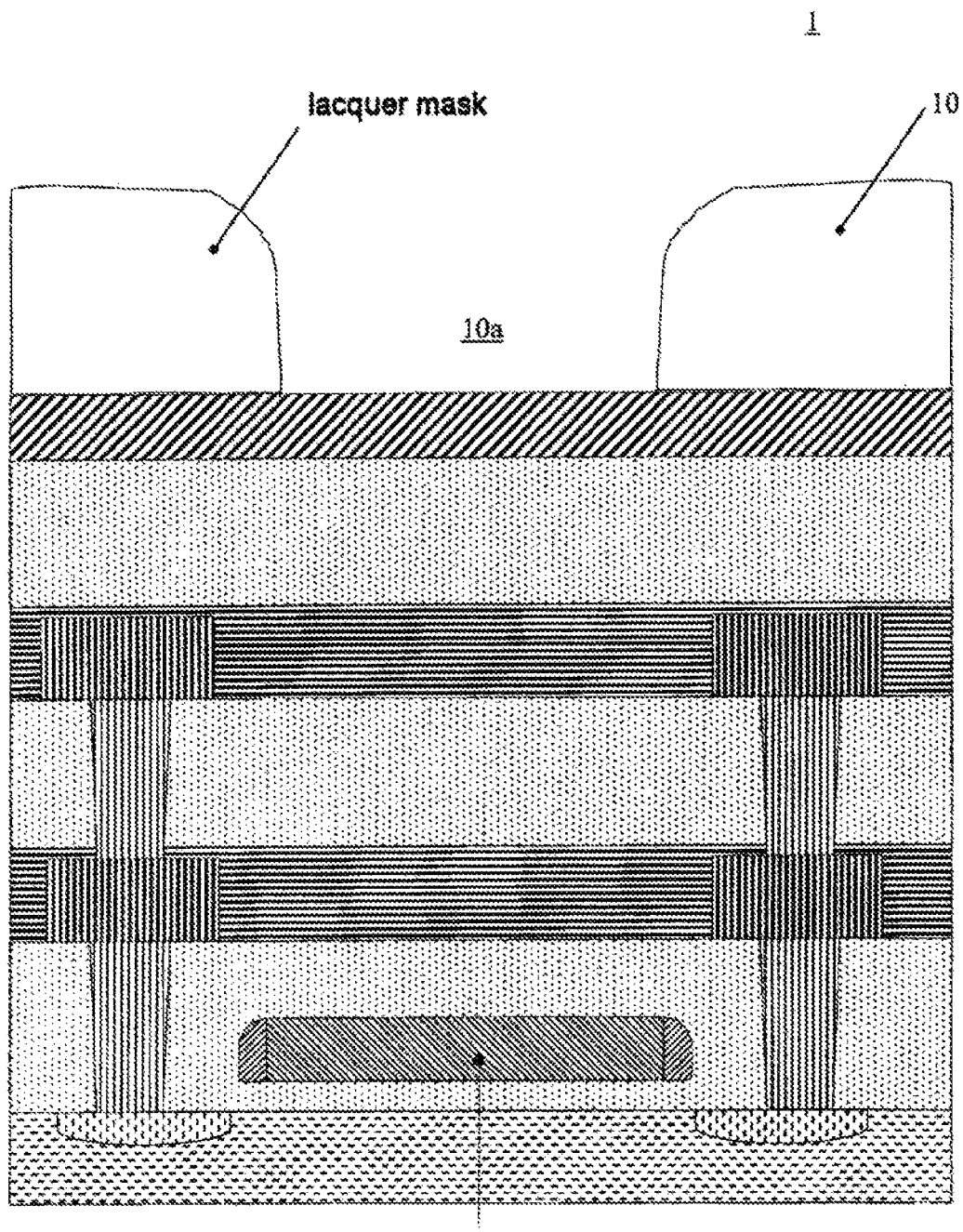
Figure 3:
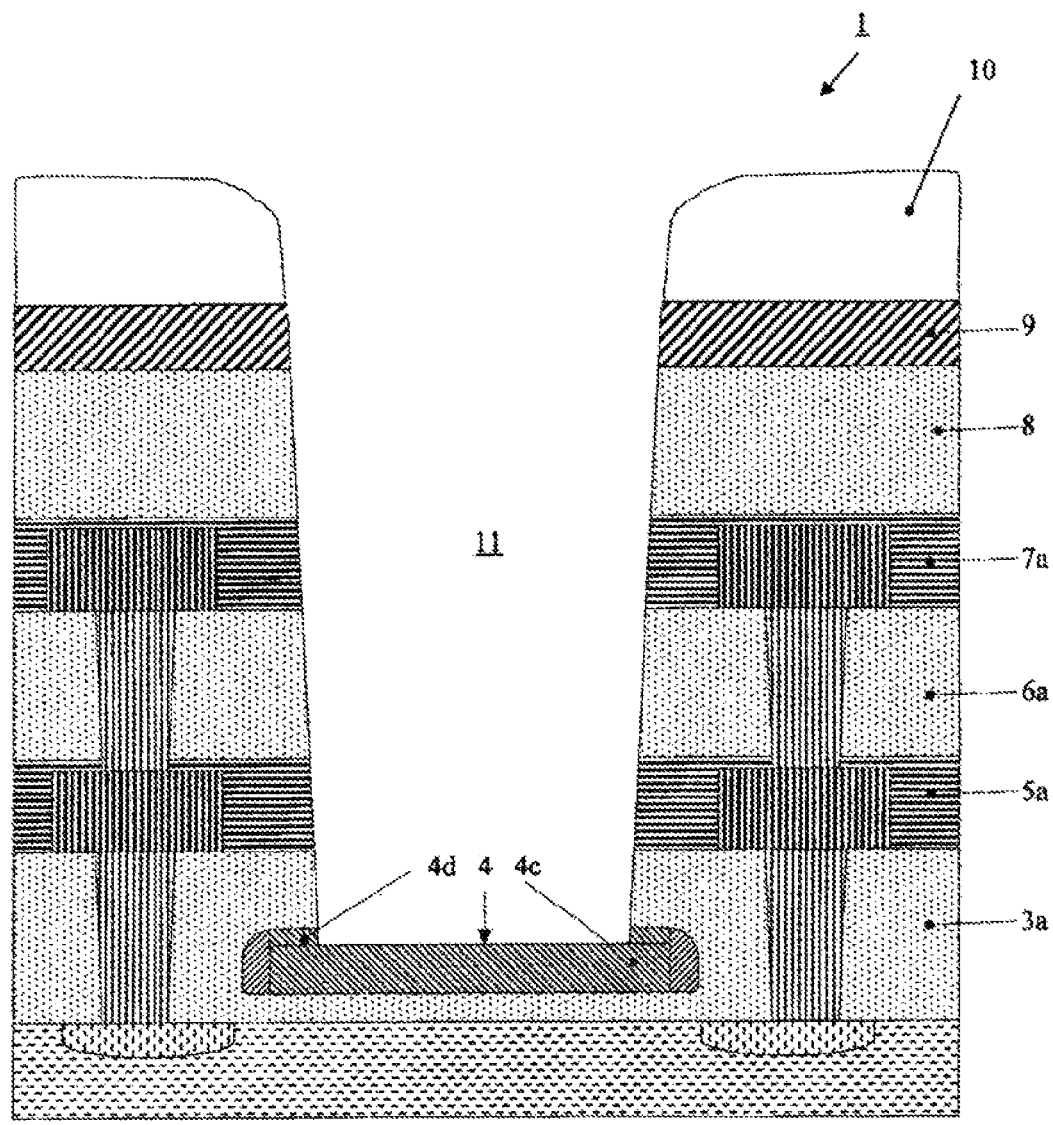
Figure 4:
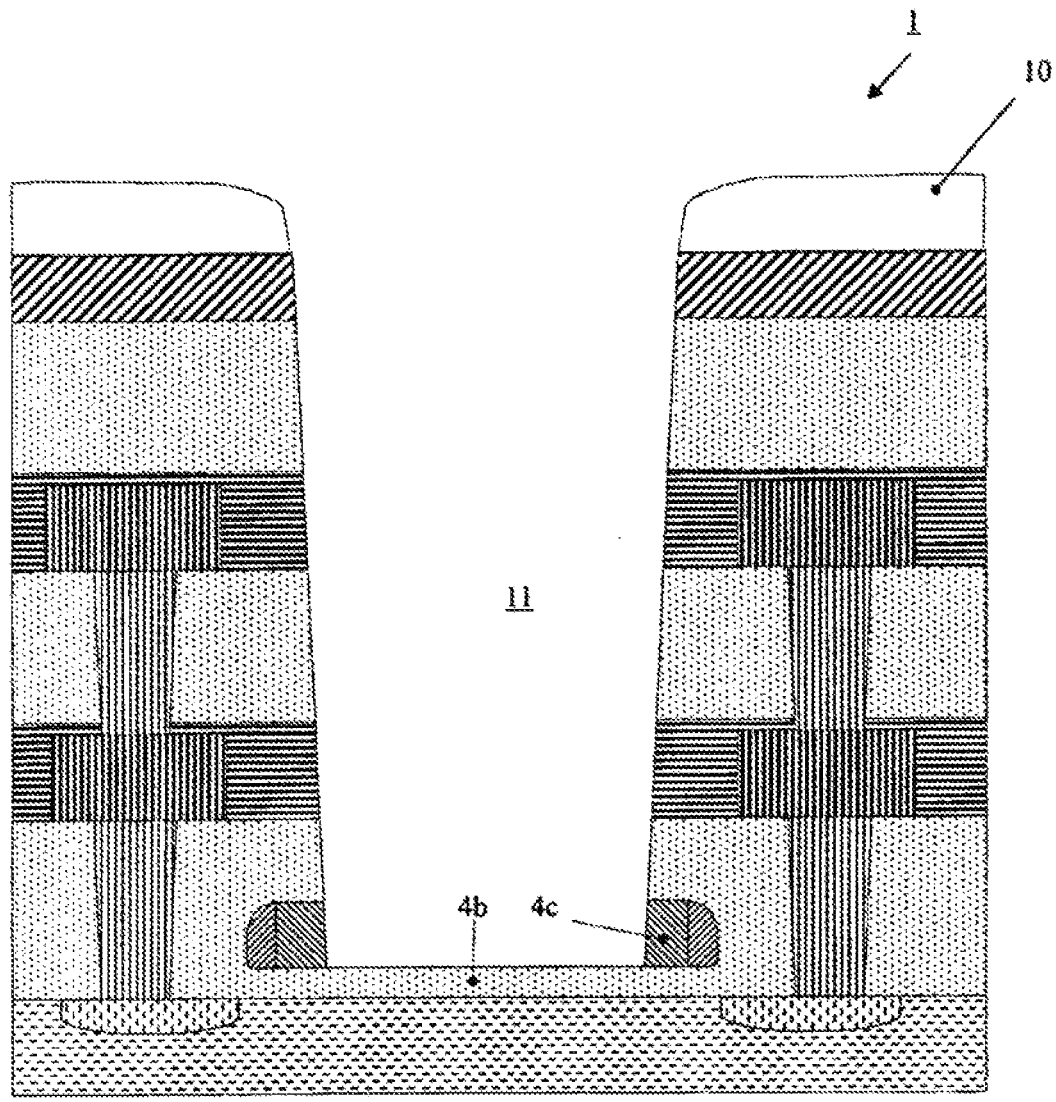
Figure 5:
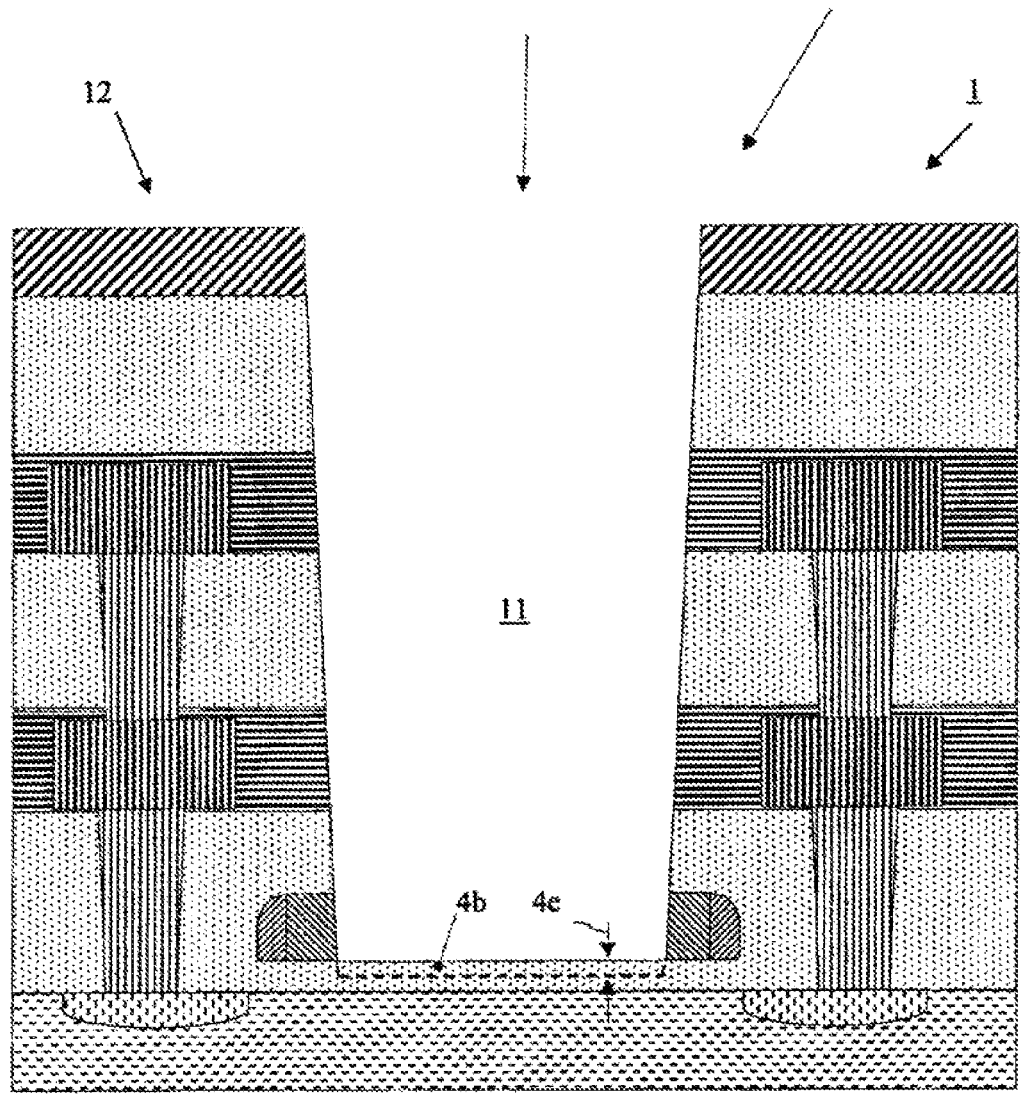
Figure 6:
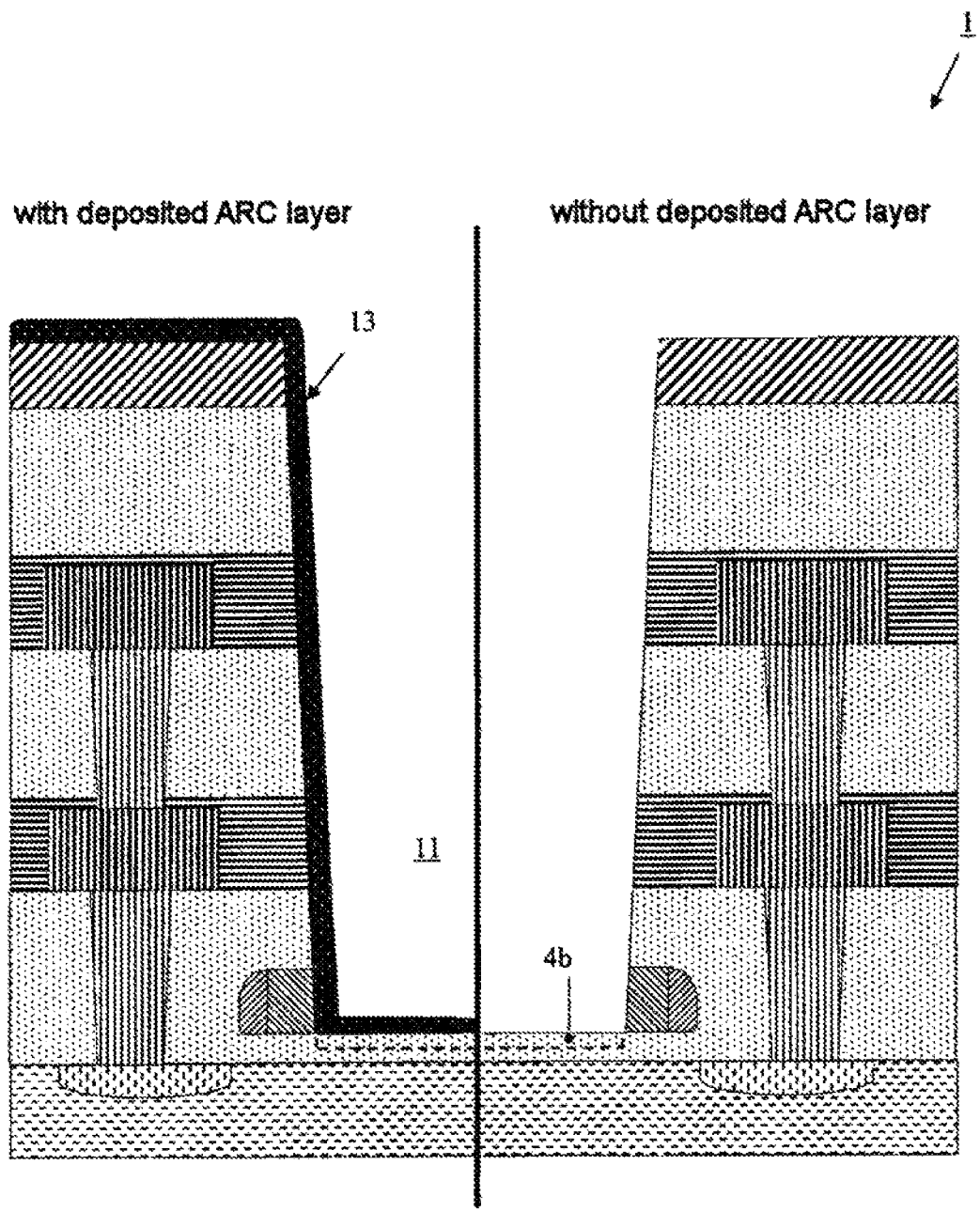
Figure 7:
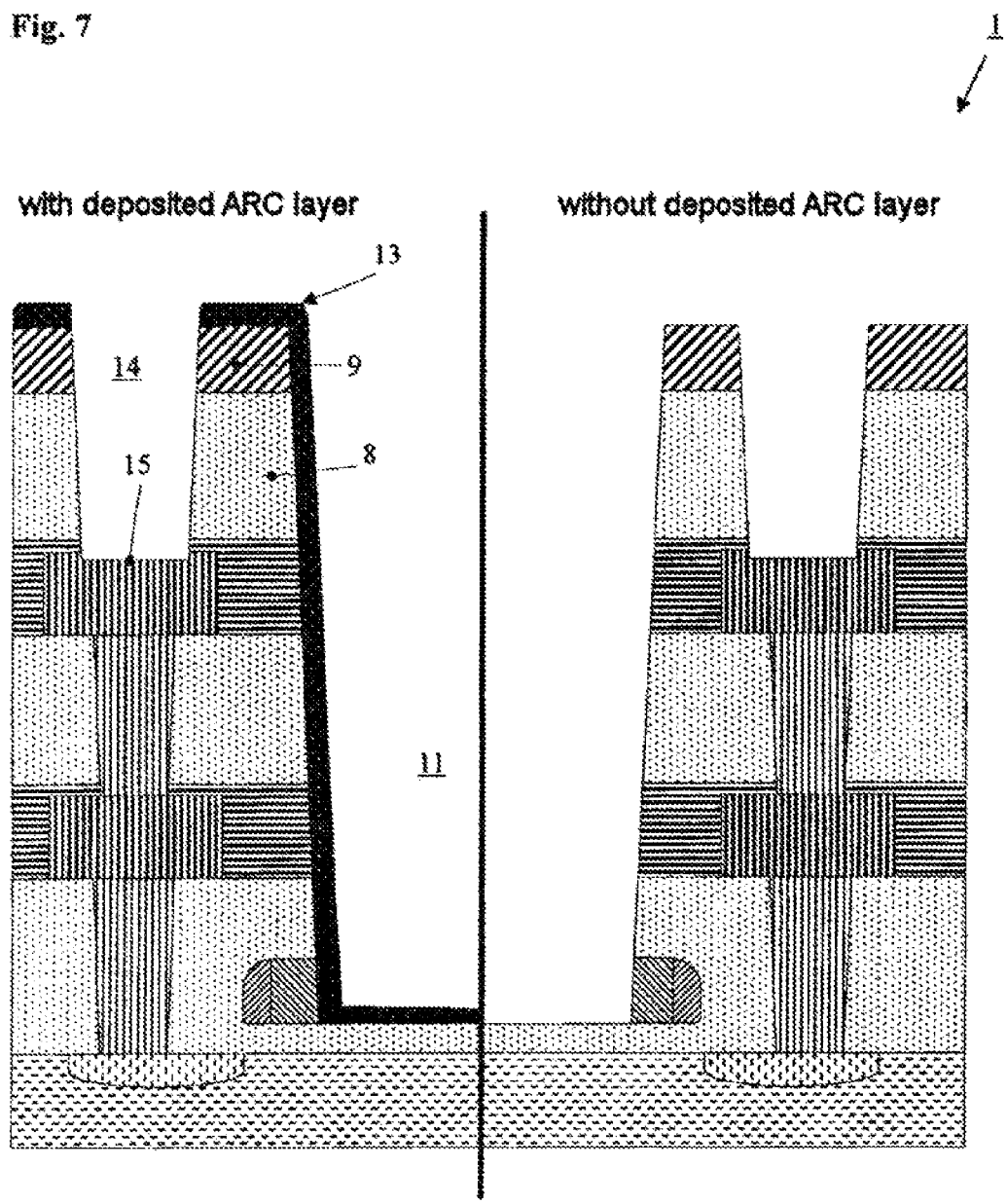

Other embodiments are defined in the claims, and are also given in the following detailed description, in which reference is made to the drawings. In the drawings:

FIG. 1 is a schematic cross-sectional view of a part of a semiconductor component, in which there should be a window opening to couple a semiconductor area to the environment, for example by optical radiation, a gate structure being provided to structure the window opening efficiently, FIG. 2 shows the semiconductor component with an etching mask, to define the lateral position and size of the window opening, FIG. 3 shows the semiconductor component after a first plasma etching process, in which the insulation layers of the metallisation system, are etched, and the electrode layer of the gate structure is used as an effective etch stopping material, FIG. 4 shows the semiconductor component after a gate etching process using known gate etching recipes, the gate insulation layer acting as an effective etch stopping material, FIG. 5 shows the semiconductor component after removal s of the etching mask, which in the shown embodiment is used for both preceding etching steps, FIG. 6 shows the semiconductor component in two variants, in one embodiment the window opening being lined with one or more optical adjustment layers, and in the other embodiment no further materials being deposited on the exposed gate insulation layer, and FIG. 7 shows the semiconductor component according to both variants of FIG. 6 after contact openings are produced for contacting the metallisation system.

FIG. 1 shows in cross-section a semiconductor component 1, which in one embodiment represents a CMOS component. FIG. 2 shows the component 1 with an etching mask 10, which defines, by an opening 10a, the lateral position and size of a window opening to be formed in the insulation layers and in part of the gate structure. FIG. 3 shows the component after a first plasma etching process, in which a window opening 11 is generated in the insulation layers 9, 8, 7a, 6a, 5a, 3a, the lateral dimensions being defined by the mask 10 and the parameters of the etching process. FIG. 4 shows the component after a further etching process, in which the electrode material 4c in the opening 11 is removed, the etching mask 10, the thickness of which is reduced by the two etching steps, continuing to be used in the shown embodiment. FIG. 5 shows the component 1 after removal of the remaining etching mask 10, which can also be done by standard methods. FIG. 6 shows the component in two variants, an embodiment with one or more optical adjustment layers 13 being shown on the left side. The layer 13 thus delimits the opening 11, so that the latter no longer extends to the gate insulation layer 4b. FIG. 7 shows the component 1 in a more advanced production state, in which contact openings 14 are formed in the insulation layers 9 and 8 (right side of FIG. 7) and in the adjustment layer 13 (left side of FIG. 7), producing a connection to connection surfaces 15.

The component 1 includes a semiconductor layer 2, for example in the form of a silicon base layer, which can be enriched at least locally with other components, and also has dopants. The semiconductor layer is deposited on any suitable carrier (not shown), for example a silicon wafer or the like. As explained above, CMOS components include doped areas or trough areas, which define the basic conductivity type of a circuit element such as a transistor. Suitable doping is provided in the shown region 2a of the semiconductor layer 2, which is under a gate structure 4, whereas strongly doped regions, for example drain and source areas 2b, are arranged laterally correlated to the gate structure 4. The gate structure 4 includes a gate insulation layer 4b, which is provided as silicon dioxide, possibly with further ingredients, and an electrode layer 4c, which is produced from doped polysilicon. Also, a spacer structure 4a is attached to side walls of the gate structure 4, which is constructed of silicon nitride, silicon dioxide and the like.

As explained above, a gate structure, which has the same structure as the gate structure 4, is used to, control the conductivity of a semiconductor area under it, for example an area which corresponds to the region 2a in transistors. Such transistors are produced in other component regions of the component, and in principle have the same structure as is shown by the gate structure 4, the drain, and source areas 2b and the area 2a, only the lateral dimensions being different, to achieve a corresponding transistor behaviour. For simplicity, such component regions with transistors are not shown. It should be noted that the lateral position of the gate structure 4 and its lateral dimensions, i.e. in FIG. 1 the dimensions in the horizontal direction and the direction perpendicular to the drawing plane, are suitably chosen to set up part of the region 2a as an Interaction zone for interaction with the 'outside world', for example by radiation, etc, The component also includes a contact level, which has a dielectric material or an insulation layer 3a, in which contact elements 3b, which produce a contact to circuit elements such as the drain and source areas 2b, are embedded. Additionally, in the shown embodiment a metallisation system, in the form of two metallisation layers 5 and 7 with a layer between them, is provided. The number of metallisation levels depends on the complexity of the circuit which is formed in and over the semiconductor layer. The metallisation layers 5 and 7 contain dielectric materials and/or insulation layers 5a and 7a, and metal lines 5b and 7b embedded in them. The layer 6 has an insulation layer 6a and contact lead-throughs 6b, which make the connection between the metal lines 5b and 7b, embedded in it. A top insulation layer 8 is also provided, and is in turn covered by a passivation layer 9.

The component 1 shown in FIG. 1 is produced by known CMOS process techniques, in particular the gate structures being produced by a lithography mask being used for the structuring, and resulting in the formation of the gate structure 4, which thus covers the interaction zone 2a, The areas 2a, 2b and the gate structure 4 are thus produced analogously to the production of transistors in other component regions, only the dimensions and position of the gate structure 4 being set by using a suitably adjusted lithography mask. The contact level 3 and the metallisation system (the insulation layers 5a, 6a, 7a, 8, 9 in combination with the metal areas 5b, 6b, 7b) are also generated according to tested production methods.

FIG. 2 shows the component 1 with an etching mask 10, which by means of an opening 10a defines the lateral position and size of a window opening to be formed in the insulation layers and in part of the gate structure. The etching mask is provided, for example, as a lacquer mask of suitable thickness, so that the initially covered regions remain protected even during the subsequent structuring process. For example, a thickness of about 2.5 µm is used. The etching mask is produced by lithography and a suitable lithography mask.

FIG. 3 shows the component after a first plasma etching process, in which a window opening 11 is generated in the insulation layers 9, 8, 7a, ea, 5a, 3a, the lateral dimensions being determined by the mask 10 and the, parameters of the etching process. As explained above, plasma etching processes are standard processes in the CMOS sequence for removal of dielectrics, for example silicon dioxide and silicon nitride, and have high selectivity in relation to polysilicon. The etching process can therefore be stopped reliably in the electrode layer 4c of the gate structure 4, this being independent of possibly pronounced over-etching times which are required because of normal variations of the thickness of the insulation layers caused by the process, in particular if relatively complex metallisation systems are considered, in some embodiments, a metal silicide 4d is present in the electrode material, which is also reliably removed.

FIG. 4 shows the component after a further etching process, in which the electrode material 4c in the opening 11 is removed, the etching mask 10, the thickness of which is reduced by the two etching steps, continuing to be used in the shown embodiment. In this etching process for etching the polysilicon, known recipes, such as were also used to structure the gate structure 4 and other gate structures of transistors in an earlier production phase, are used. Since these well established etching processes have high selectivity to the gate insulation layer 4b, i.e. the etch rate of the material of the gate insulation layer 4b is very low, the etching process is reliably stopped in the gate insulation layer, the electrode material being completely removed. Thus an electrode layer with a thickness of 100 to several hundred nm is made possible with material removal in the gate insulation layer 4b of one to a few nm. Consequently, the integrity of the semiconductor area 2a under it is retained, and thus also its electronic properties.

FIG. 5 shows the component 1 after removal of the remaining etching mask 10, which can also be done by standard methods. in one embodiment, a cleaning process 12 is carried out in this phase on the basis of wet chemical recipes, for example on the basis of hydrofluoric acid, and the like. Therefore, etching byproducts such as polymer residues are effectively removed. At least one process parameter, for example the application time, can therefore be used to set a degree of material erosion in the gate insulation layer 4b in the window opening 11, as is given by 4e. In this way, the influence of the gate insulation layer 4b on the "interface function" of the window opening can be set. If, for example, the influence of the gate insulation layer 4b on coupling or decoupling light is to be changed, or the response sensitivity in a sensor is to be increased, the residual layer thickness can be reduced by the cleaning process in a highly controllable manner.

FIG. 6 shows the component in two variants, an embodiment with one or more optical adjustment layers 13 being shown on the left side. The layer 13 thus delimits the opening 11, so that the latter no longer extends to the gate insulation layer 4b. The adjustment layer 13, which can represent a reflection-reducing layer or a layer system, makes it possible to improve or set the interface function of the window opening 11. In particular in combination with the gate insulation layer 4b and any thickness adjustment of this layer, a wide range of variations for setting the optical properties of the window opening 11 is possible.

On the right side of FIG. 6, the variant in which no further materials are deposited on the gate insulation layer 4b is shown.

FIG. 7 shows the component 1 in a more advanced production state, in which contact openings 14 are formed in the insulation layers 9 and 8 (right side of FIG. 7) and in the adjustment layer 13 (left side of FIG. 7), and produce a connection to the connection surfaces 15. The contact surfaces are used, for example, for attaching bonding wires, which make electrical contacting of the component with a housing possible. The contact openings 14 can be produced according to well established CMOS processes.

Thus all examples make it possible to produce the window 11 with desired lateral is dimensions, which can range from a few hundred nm to several mm, the integrity of the semiconductor area 2a, he. the interaction zone in the semiconductor material, being completely retained. A on junction, the property of which is conserved after the window is structured, can be generated in this zone, so that very sensitive optical components can be produced. The process sequence is more efficient than in many conventional methods in which optical components are produced.

The prevent invention results in very high process stability and thus a high yield, very small optical windows at a very small distance from each other being possible. A high degree of compatibility is achieved because of the small process changes compared with the process of CMOS circuit elements, since no additional layers are required and established etching steps are used. For the interaction zones, the result is the highest freedom from defects because of the use of the active surface of MOS components, without the latter being exposed in the window structuring. In this way, multiple photocells can be arranged in one optical window. This makes it possible to produce sector sensors with the smallest possible sector separation. The optical properties of the windows can be set efficiently by reflection reduction by means of subsequent deposition of ARC (anti-reflective coating) layers.

We claim:

1. A semiconductor component having a gate structure formed on a semiconductor layer and having a gate insulation layer (4b) formed on a radiation interaction zone (2a) of the semiconductor layer, comprising:
    a metallization system having several insulation layers and metal lines vertically connected by contact lead throughs;
    a window opening (11) formed in and through the insulation layers and penetrating an electrode layer (4c) that is provided on top of the gate insulation layer (4b);
    the window opening (11) configured to act as an interface between the radiation interaction zone (2a) and an environment of the semiconductor component; and
    the window opening (11) having an optical adjustment layer, formed at least on the gate insulation layer (4b) and suitable for reducing radiation reflection.

2. The semiconductor component according to claim 1, wherein the window opening (11) extends as far as the gate insulation layer (4b) and through the electrode layer (4c).

3. The semiconductor component according to claim 1, wherein the electrode layer (4c) comprises polysilicon.

4. The semiconductor component according to claim 3, wherein the electrode layer has, laterally adjacent to the window opening, a metal silicide (4d).

5. The semiconductor component according to claim 3, wherein a portion of the electrode layer that is laterally adjacent to the window opening comprises polysilicon.

6. The semiconductor component according to claim 1, wherein the window opening is an optical interface of a photodiode provided in the radiation interaction zone.

7. The semiconductor component according to claim 1, wherein the window opening is an optical interface of a pixel of an opto-electronic region of the semiconductor component.

8. The semiconductor component according to claim 1, wherein the window opening is an optical interface of a phototransistor.

9. The semiconductor component according to claim 1, wherein two or more window openings are provided through the insulation layers and act as optical interfaces.

10. The semiconductor component according to claim 1, wherein the electrode layer has a maximum vertical extension of 100 nm to 500 nm, outside the window opening that penetrates the electrode layer.

11. The semiconductor component according to claim 1, wherein a thickness of the gate insulation layer (4b) below a bottom end of the window opening is between 3 nm and 20 nm.

12. The semiconductor component according to claim 1, having a PN junction in the semiconductor layer below a bottom end of the window opening (11).

13. The semiconductor component according to claim 1, wherein the semiconductor layer comprises silicon and at least one dopant.

14. A semiconductor component having a gate structure formed on a semiconductor layer and having a gate insulation layer (4b) formed on a radiation interaction zone (2a) of the semiconductor layer, comprising:
    a metallization system comprising several insulation layers and horizontal metal lines, vertically connected by electrical conductive contact lead throughs;
    a window opening (11) formed in and through the insulation layers and penetrating an electrode layer (4c) that is provided on the gate insulation layer (4b), the window opening (11) configured to act as a radiation interface between the radiation interaction zone (2a) and an environment.

15. The semiconductor component according to claim 14, wherein a thickness of the gate insulation layer below a bottom end of the window opening is between 3 nm and 20 Nm.

16. The semiconductor component according to claim 14, having a PN junction in the semiconductor layer below a bottom end of the window opening (11).

17. The semiconductor component according to claim 14, wherein the semiconductor layer comprises silicon and at least one dopant.

* * * * *